United States Patent
Satoh et al.

(10) Patent No.: US 8,697,550 B2
(45) Date of Patent: Apr. 15, 2014

(54) METHOD OF MANUFACTURING GAN-BASED FILM

(75) Inventors: Issei Satoh, Itami (JP); Yuki Seki, Itami (JP); Koji Uematsu, Itami (JP); Yoshiyuki Yamamoto, Itami (JP); Hideki Matsubara, Itami (JP); Shinsuke Fujiwara, Itami (JP); Masashi Yoshimura, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 13/643,206

(22) PCT Filed: Nov. 10, 2011

(86) PCT No.: PCT/JP2011/075961
§ 371 (c)(1),
(2), (4) Date: Oct. 24, 2012

(87) PCT Pub. No.: WO2012/067015
PCT Pub. Date: May 24, 2012

(65) Prior Publication Data
US 2013/0040442 A1    Feb. 14, 2013

(30) Foreign Application Priority Data

Nov. 15, 2010   (JP) ................................ 2010-254529
Nov. 16, 2010   (JP) ................................ 2010-255840
Oct. 20, 2011   (JP) ................................ 2011-230682

(51) Int. Cl.
*H01L 21/20*    (2006.01)
(52) U.S. Cl.
USPC ........................................................ 438/478

(58) Field of Classification Search
USPC ........................................................ 438/478
See application file for complete search history.

(56) References Cited

U.S. PATENT DOCUMENTS

| | | |
|---|---|---|
| 5,290,393 A | 3/1994 | Nakamura |
| 6,413,627 B1 | 7/2002 | Motoki et al. |
| 2004/0033638 A1 | 2/2004 | Bader et al. |
| 2008/0169483 A1 | 7/2008 | Kasai et al. |
| 2008/0296585 A1 | 12/2008 | Matsumoto et al. |
| 2010/0210089 A1 | 8/2010 | Kasai et al. |

(Continued)

FOREIGN PATENT DOCUMENTS

| | | |
|---|---|---|
| CN | 1471733 A | 1/2004 |
| CN | 101246899 A | 8/2008 |

(Continued)

*Primary Examiner* — Bradley K Smith
(74) *Attorney, Agent, or Firm* — Drinker Biddle & Reath LLP (57) ABSTRACT

The present method of manufacturing a GaN-based film includes the steps of preparing a composite substrate, the composite substrate including a support substrate in which a coefficient of thermal expansion in a main surface is more than 0.8 time and less than 1.2 times as high as a coefficient of thermal expansion of GaN crystal in a direction of a axis and a single crystal film arranged on a side of the main surface of the support substrate, the single crystal film having threefold symmetry with respect to an axis perpendicular to a main surface of the single crystal film, and forming a GaN-based film on the main surface of the single crystal film in the composite substrate. Thus, a method of manufacturing a GaN-based film capable of manufacturing a GaN-based film having a large main surface area and less warpage is provided.

7 Claims, 2 Drawing Sheets

(56) References Cited

U.S. PATENT DOCUMENTS

2012/0118222 A1    5/2012   Fujiwara et al.
2012/0119218 A1*   5/2012   Su .................................. 257/76
2012/0122301 A1    5/2012   Fujiwara et al.

FOREIGN PATENT DOCUMENTS

| | | |
|---|---|---|
| CN | 101319402 A | 12/2008 |
| JP | 4-297023 | 10/1992 |
| JP | 2000-22212 | 1/2000 |
| JP | 2000-44400 | 2/2000 |
| JP | 2002-293697 | 10/2002 |
| JP | 2006-261476 | 9/2006 |
| JP | 2007-523472 | 8/2007 |
| JP | 2007-246289 | 9/2007 |
| JP | 2008-10766 | 1/2008 |
| JP | 2010-182936 | 8/2010 |
| WO | 2005/076345 | 8/2005 |

* cited by examiner

METHOD OF MANUFACTURING GAN-BASED FILM

TECHNICAL FIELD

The present invention relates to a method of manufacturing a GaN-based film capable of obtaining a GaN-based film having a large main surface area and less warpage.

BACKGROUND ART

A GaN-based film is suitably used as a substrate and a semiconductor layer in a semiconductor device such as a light emitting device and an electronic device. A GaN substrate is best as a substrate for manufacturing such a GaN-based film, from a point of view of match or substantial match in lattice constant and coefficient of thermal expansion between the substrate and the GaN-based film. A GaN substrate, however, is very expensive, and it is difficult to obtain such a GaN substrate having a large diameter that a diameter of a main surface exceeds 2 inches.

Therefore, a sapphire substrate is generally used as a substrate for forming a GaN-based film. A sapphire substrate and a GaN crystal are significantly different from each other in lattice constant and coefficient of thermal expansion.

Therefore, in order to mitigate unmatch in lattice constant between a sapphire substrate and a GaN crystal and to grow a GaN crystal having good crystallinity, for example, Japanese Patent Laying-Open No. 04-297023 discloses forming a GaN buffer layer on a sapphire substrate and growing a GaN crystal layer on the GaN buffer layer, in growing GaN crystal on the sapphire substrate.

In addition, in order to obtain a GaN film less in warpage by employing a substrate having a coefficient of thermal expansion close to that of GaN crystal, for example, Japanese National Patent Publication No. 2007-523472 discloses a composite support substrate having one or more pairs of layers having substantially the same coefficient of thermal expansion with a central layer lying therebetween and having an overall coefficient of thermal expansion substantially the same as a coefficient of thermal expansion of GaN crystal.

CITATION LIST

Patent Literature

PTL 1: Japanese Patent Laying-Open No. 04-297023
PTL 2: Japanese National Patent Publication No. 2007-523472

SUMMARY OF INVENTION

Technical Problem

According to Japanese Patent Laying-Open No. 04-297023 above, GaN crystal grows as warping in a shape recessed in a direction of growth of crystal, probably because crystal defects such as dislocation disappear as a result of association during growth of the GaN crystal.

As described above, however, the sapphire substrate is much higher in coefficient of thermal expansion than GaN crystal, and hence grown GaN crystal greatly warps in a shape projecting in a direction of growth of crystal during cooling after crystal growth and a GaN film great in warpage in a shape projecting in the direction of growth of crystal is obtained. Here, as the main surface of the sapphire substrate has a greater diameter, warpage of the GaN crystal during cooling above becomes greater (specifically, warpage of the obtained GaN film is substantially in proportion to a square of a diameter of the main surface of the sapphire substrate). Therefore, it becomes difficult to obtain a GaN film less in warpage as the main surface has a greater diameter.

The composite support substrate disclosed in Japanese National Patent Publication No. 2007-523472 above has a coefficient of thermal expansion substantially the same as that of the GaN crystal and hence warpage of the GaN layer grown thereon can be less. Such a composite support substrate, however, has a complicated structure, and design and formation of the structure is difficult. Therefore, cost for design and manufacturing becomes very high and cost for manufacturing a GaN film becomes very high.

An object of the present invention is to solve the problems above and to provide a method of manufacturing a GaN-based film capable of manufacturing a GaN-based film having a large main surface area and less warpage.

Solution to Problem

According to one aspect, the present invention is directed to a method of manufacturing a GaN-based film including the steps of preparing a composite substrate, the composite substrate including a support substrate in which a coefficient of thermal expansion in a main surface is more than 0.8 time and less than 1.2 times as high as a coefficient of thermal expansion of GaN crystal in a direction of a axis and a single crystal film arranged on a side of a main surface of the support substrate, the single crystal film having threefold symmetry with respect to an axis perpendicular to a main surface of the single crystal film, and forming a GaN-based film on a main surface of the single crystal film in the composite substrate.

In the method of manufacturing a GaN-based film according to the present invention, the main surface of the single crystal film in the composite substrate can have an area equal to or greater than 45 cm$^2$. In addition, the support substrate of the composite substrate can be made of a sintered body containing an oxide. Moreover, the support substrate of the composite substrate can contain yttria stabilized zirconia and an $Al_2O_3$—$SiO_2$ composite oxide formed of alumina and silica. Here, a content of yttria stabilized zirconia to the total of the $Al_2O_3$—$SiO_2$ composite oxide and yttria stabilized zirconia can be not lower than 20 mass % and not higher than 40 mass %. Further, a content of yttria to yttria stabilized zirconia can be not lower than 5 mol %. Furthermore, the step of forming a GaN-based film can include sub steps of forming a GaN-based buffer layer on the main surface of the single crystal film and forming a GaN-based single crystal layer on a main surface of the GaN-based buffer layer.

Advantageous Effects of Invention

According to the present invention, a method of manufacturing a GaN-based film capable of manufacturing a GaN-based film having a large main surface area and less warpage can be provided.

DESCRIPTION OF EMBODIMENTS

Figure 1:
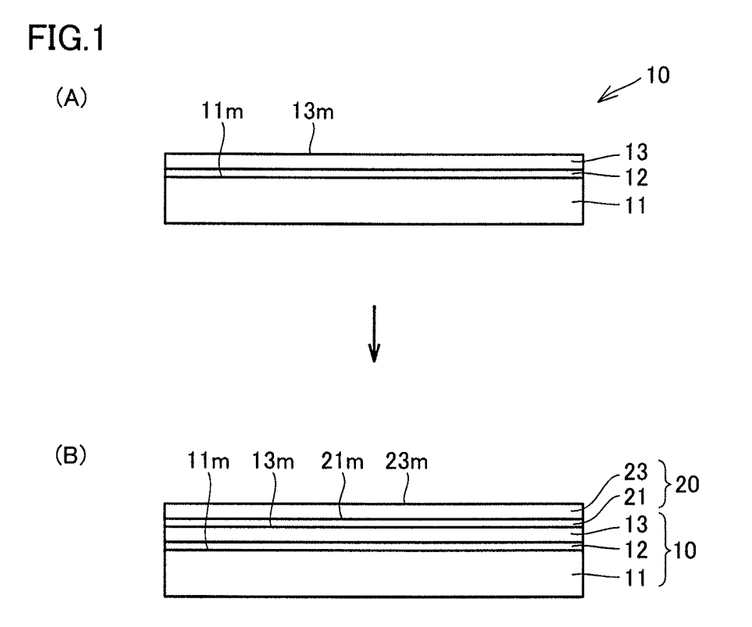
FIG. 1 is a schematic cross-sectional view showing one example of a method of manufacturing a GaN-based film according to the present invention, (A) showing the step of preparing a composite substrate and (B) showing the step of forming a GaN-based film.

Referring to FIG. 1, one embodiment of a method of manufacturing a GaN-based film according to the present invention includes the steps of preparing a composite substrate 10 including a support substrate 11 in which a coefficient of thermal expansion in a main surface 11$m$ is more than 0.8 time and less than 1.2 times as high as a coefficient of thermal expansion of GaN crystal in a direction of a axis and a single crystal film 13 arranged on a main surface 11$m$ side of support substrate 11, single crystal film 13 having threefold symmetry with respect to an axis perpendicular to a main surface 13$m$ of single crystal film 13 (FIG. 1(A)), and forming a GaN-based film 20 on main surface 13$m$ of single crystal film 13 in composite substrate 10 (FIG. 1(B)). Here, the GaN-based film refers to a film formed of a group III nitride containing Ga as a group III element and it is exemplified, for example, by a $Ga_xIn_yAl_{1-x-y}N$ film (x>0, y≥0 x+y≤1).

According to the method of manufacturing a GaN-based film in the present embodiment, by employing a composite substrate including a support substrate in which a coefficient of thermal expansion in a main surface is more than 0.8 time and less than 1.2 times as high as a coefficient of thermal expansion of GaN crystal in a direction of a axis and a single crystal film arranged on a main surface side of the support substrate, the single crystal film having threefold symmetry with respect to an axis perpendicular to a main surface of the crystal film, a GaN-based film having a large main surface area (that is, a large diameter) and less warpage can be obtained.

(Step of Preparing Composite Substrate)

Referring to FIG. 1(A), the method of manufacturing a GaN-based film in the present embodiment includes the step of preparing composite substrate 10 including support substrate 11 in which a coefficient of thermal expansion in main surface 11$m$ is more than 0.8 time and less than 1.2 times as high as a coefficient of thermal expansion of GaN crystal in the direction of a axis and single crystal film 13 arranged on the main surface 11$m$ side of support substrate 11, single crystal film 13 having threefold symmetry with respect to the axis perpendicular to main surface 13$m$ of single crystal film 13.

Composite substrate 10 above includes support substrate 11 in which a coefficient of thermal expansion in main surface 11$m$ matches with or is close to (specifically, more than 0.8 time and less than 1.2 times as high as) a coefficient of thermal expansion of GaN crystal in the direction of a axis and single crystal film 13 arranged on the main surface 11$m$ side of support substrate 11, and single crystal film 13 has threefold symmetry with respect to the axis perpendicular to main surface 13$m$ of single crystal film 13. Therefore, a GaN-based film less in warpage, low in dislocation density, and having a large diameter can be grown on main surface 13$m$ of single crystal film 13 of composite substrate 10.

From a point of view of growing a GaN-based film less in warpage, low in dislocation density, and having a large diameter on single crystal film 13 of composite substrate 10, support substrate 11 included in composite substrate 10 above should have a coefficient of thermal expansion in main surface 11$m$ more than 0.8 time and less than 1.2 times, preferably more than 0.9 time and less than 1.15 times and further preferably more than 0.95 time and less than 1.1 times, as high as a coefficient of thermal expansion of GaN crystal in the direction of a axis.

Here, support substrate 11 is not particularly restricted, so long as a substrate has a coefficient of thermal expansion in main surface 11$m$ more than 0.8 time and less than 1.2 times as high as a coefficient of thermal expansion of GaN crystal in the direction of a axis, and a substrate may be monocrystalline, polycrystalline, or non-crystalline. Support substrate 11 is preferably made of a sintered body containing an oxide, from a point of view of ease in adjustment of a coefficient of thermal expansion based on variation in type and ratio of source materials and ease in obtaining a coefficient of thermal expansion in the range above, resistance to an atmosphere in which a GaN-based film is grown, and allowing selective etching by such a solvent as hydrofluoric acid (hydrogen fluoride) after growth of a GaN-based film. For example, preferred examples of the sintered bodies include an $Al_2O_3$—$SiO_2$-based sintered body, an MgO—$SiO_2$-based sintered body, a $ZrO_2$—$SiO_2$-based sintered body, a $ZrO_2$—$Al_2O_3$—$SiO_2$-based sintered body, a $Y_2O_3$—$Al_2O_3$—$SiO_2$-based sintered body, a $Y_2O_3$—$ZrO_2$—$Al_2O_3$—$SiO_2$-based sintered body, and the like.

Alternatively, support substrate 11 particularly preferably contains yttria stabilized zirconia ($Y_2O_3$ stabilized $ZrO_2$, hereinafter also referred to as YSZ) and an $Al_2O_3$—$SiO_2$ composite oxide formed of alumina ($Al_2O_3$) and silica ($SiO_2$). Support substrate 11 containing the $Al_2O_3$—$SiO_2$ composite oxide and YSZ (yttria stabilized zirconia) is dissoluble in hydrofluoric acid (hydrogen fluoride) and it allows growth of a GaN-based film excellent in crystallinity on single crystal film 13 arranged on the main surface side of support substrate 11 of composite substrate 10. Here, the $Al_2O_3$—$SiO_2$ composite oxide is not particularly restricted, and mullite ($3Al_2O_3.2SiO_2$ to $2Al_2O_3.SiO_2$ or $Al_6O_{13}Si_2$) or the like is suitable.

From a point of view of suppression of cracks generated in a GaN-based film during growth of a GaN-based film excellent in crystallinity on single crystal film 13 on support substrate 11 containing an $Al_2O_3$—$SiO_2$ composite oxide and YSZ (yttria stabilized zirconia), a content of YSZ to the total of the $Al_2O_3$—$SiO_2$ composite oxide and YSZ is preferably not lower than 20 mass % and not higher than 40 mass % and more preferably not lower than 25 mass % and not higher than 35 mass %. Further, from a point of view the same as above, a content of yttria ($Y_2O_3$) to YSZ is preferably not lower than 5 mol % and more preferably not lower than 6 mol % and not higher than 50 mol %.

Here, since a coefficient of thermal expansion of each of support substrate 11 and GaN crystal generally greatly fluctuates depending on a temperature thereof, it is important at which temperature or in which temperature region determination should be made based on a coefficient of thermal expansion. The present invention aims to manufacture a GaN-based film less in warpage on a composite substrate. A GaN-based film is formed on the composite substrate at a film formation temperature for a GaN-based film with a temperature being increased from room temperature, thereafter the temperature is lowered to room temperature, and then the GaN-based film formed on the composite substrate is taken out. Therefore, it is considered as appropriate to handle an average coefficient of thermal expansion of each of the support substrate and the GaN crystal from room temperature to the film formation temperature for the GaN-based film as the coefficient of thermal expansion of each of the support substrate and the GaN crystal. The GaN crystal, however, decomposes even in an inert gas atmosphere if a temperature exceeds 800° C. Therefore, in the present invention, the coefficient of thermal expansion of each of the support substrate and the GaN crystal is determined by an average coefficient of thermal expansion from room temperature (specifically, 25° C.) to 800° C.

In addition, from a point of view of growing a GaN-based film less in warpage, low in dislocation density, and having a large diameter on single crystal film 13 of composite substrate 10, single crystal film 13 arranged on the main surface 11$m$ side of support substrate 11 included in composite substrate 10 above should have threefold symmetry with respect to the axis perpendicular to main surface 13$m$ of single crystal film 13, and preferred examples of the single crystal film include a sapphire film having a (0001) plane as main surface 13$m$, an SiC film having a (0001) plane as main surface 13$m$, an Si film having a (111) plane as main surface 13$m$, a GaAs film having a (111) plane as main surface 13$m$, and the like. Here, the single crystal film having threefold symmetry with respect to the axis perpendicular to the main surface of the single crystal film does not mean having threefold symmetry strict in terms of crystal geometry but having substantial threefold symmetry in an actual single crystal film, and specifically means that an absolute value of an angle between a threefold symmetry axis strict in terms of crystal geometry of the single crystal film and an axis perpendicular to the main surface of the single crystal film being not greater than 10° suffices.

From a point of view of lessening warpage and lowering dislocation density in composite substrate 10, main surface 11$m$ of support substrate 11 and main surface 13$m$ of single crystal film 13 are preferably substantially parallel to each other. Here, two surfaces being substantially parallel to each other means that an absolute value of an angle formed by these two surfaces is not greater than 10°.

In addition, a method of arranging single crystal film 13 on the main surface 11$m$ side of support substrate 11 of composite substrate 10 is not particularly restricted, and exemplary methods include a method of directly growing single crystal film 13 on main surface 11$m$ of support substrate 11 (a first method), a method of bonding single crystal film 13 formed on a main surface of an underlying substrate to main surface 11$m$ of support substrate 11 and thereafter removing the underlying substrate (a second method), a method of bonding single crystal (not shown) to main surface 11$m$ of support substrate 11 and thereafter separating the single crystal at a plane at a prescribed depth from a bonding surface to thereby form single crystal film 13 on main surface 11$m$ of support substrate 11 (a third method), and the like. In a case where a support substrate is made of a polycrystalline sintered body, the first method above is difficult and hence any of the second and third methods above is preferably employed. A method of bonding single crystal film 13 to support substrate 11 in the second method above is not particularly restricted, and exemplary methods include a method of directly bonding single crystal film 13 to main surface 11$m$ of support substrate 11, a method of bonding single crystal film 13 to main surface 11$m$ of support substrate 11 with an adhesive layer 12 being interposed, and the like. A method of bonding single crystal to support substrate 11 in the third method above is not particularly restricted, and exemplary methods include a method of directly bonding single crystal to main surface 11$m$ of support substrate 11, a method of bonding single crystal to main surface 11$m$ of support substrate 11 with adhesive layer 12 being interposed, and the like.

The step of preparing composite substrate 10 above is not particularly restricted. From a point of view of efficient preparation of composite substrate 10 of high quality, however, for example, referring to FIG. 2, the second method above can include a sub step of preparing support substrate 11 (FIG. 2(A)), a sub step of forming single crystal film 13 on a main surface 30$n$ of an underlying substrate 30 (FIG. 2(B)), a sub step of bonding support substrate 11 and single crystal film 13 to each other (FIG. 2(C)), and a sub step of removing underlying substrate 30 (FIG. 2(D)).

Figure 2:
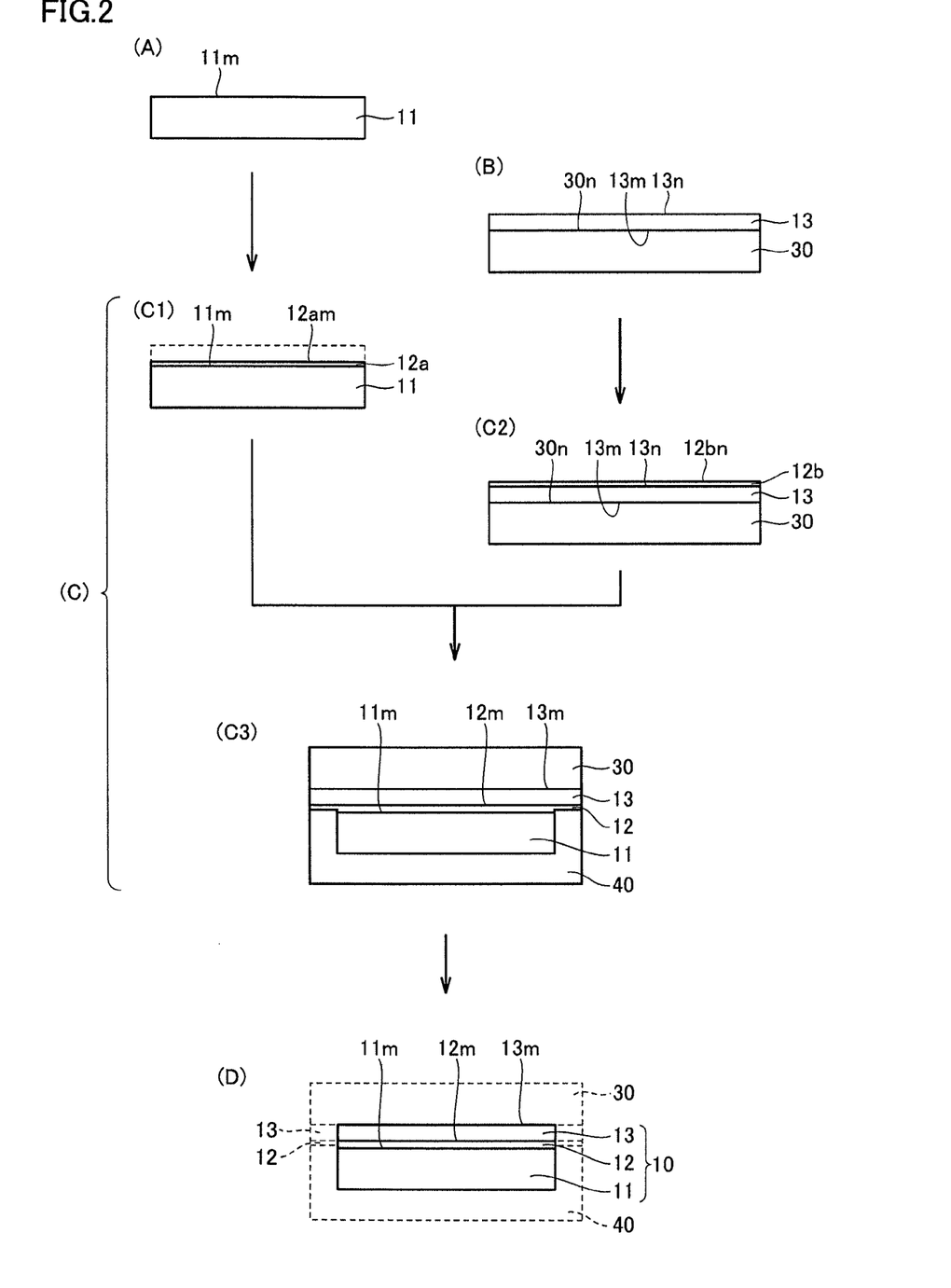
FIG. 2 is a schematic cross-sectional view showing one example of the step of preparing a composite substrate used in the method of manufacturing a GaN-based film according to the present invention, (A) showing a sub step of preparing a support substrate, (B) showing a sub step of forming a single crystal film on an underlying substrate, (C) showing a sub step of bonding a single crystal film to the support substrate, and (D) showing a sub step of separating the underlying substrate from the single crystal film.

In FIG. 2(C), in the sub step of bonding support substrate 11 and single crystal film 13 to each other, an adhesive layer 12$a$ is formed on main surface 11$m$ of support substrate 11 (FIG. 2(C1)), an adhesive layer 12$b$ is formed on a main surface 13$n$ of single crystal film 13 grown on main surface 30$n$ of underlying substrate 30 (FIG. 2(C2)), thereafter a main surface 12 am of adhesive layer 12$a$ formed on support substrate 11 and a main surface 12$bn$ of adhesive layer 12$b$ formed on single crystal film 13 formed on underlying substrate 30 are bonded to each other, and thus support substrate 11 and single crystal film 13 are bonded to each other with adhesive layer 12 formed by joint between adhesive layer 12$a$ and adhesive layer 12$b$ being interposed (FIG. 2(C3)). If support substrate 11 and single crystal film 13 can be joined to each other, however, support substrate 11 and single crystal film 13 can directly be bonded to each other without adhesive layer 12 being interposed.

A specific technique for bonding support substrate 11 and single crystal film 13 to each other is not particularly restricted. From a point of view of ability to hold joint strength even at a high temperature after bonding, however, a direct joint method of washing a bonding surface, performing bonding, and thereafter increasing a temperature to about 600° C. to 1200° C. for joint, a surface activation method of washing a bonding surface, activating the bonding surface with plasma, ions or the like, and thereafter performing joint at a low temperature from around room temperature (for example, 25° C.) to 400° C., and the like are preferably employed.

(Step of Forming GaN-Based Film)

Referring to FIG. 1(B), the method of manufacturing a GaN-based film in the present embodiment includes the step of forming GaN-based film 20 on main surface 13$m$ of single crystal film 13 in composite substrate 10.

Composite substrate 10 prepared in the step of preparing a composite substrate above includes support substrate 11 in which a coefficient of thermal expansion in main surface 11$m$ matches with or is close to (specifically, more than 0.8 time and less than 1.2 times as high as) a coefficient of thermal expansion of GaN crystal in the direction of a axis and single crystal film 13 arranged on the main surface 11$m$ side of support substrate 11, and single crystal film 13 has threefold symmetry with respect to the axis perpendicular to main surface 13$m$ of single crystal film 13. Therefore, GaN-based film 20 less in warpage, low in dislocation density, and having a large diameter can be formed on main surface 13$m$ of single crystal film 13 of composite substrate 10.

Though a method of forming a GaN-based film is not particularly restricted, from a point of view of forming a GaN-based film low in dislocation density, a vapor phase epitaxy method such as an MOCVD (Metal Organic Chemical Vapor Deposition) method, an HVPE (Hydride Vapor Phase Epitaxy) method, an MBE (Molecular Beam Epitaxy) method, and a sublimation method, a liquid phase epitaxy method such as a flux method and a high nitrogen pressure solution method, and the like are preferably exemplified.

The step of forming a GaN-based film is not particularly restricted. From a point of view of forming a GaN-based film low in dislocation density, however, the step preferably includes a sub step of forming a GaN-based buffer layer 21 on main surface 13m of single crystal film 13 of composite substrate 10 and a sub step of forming a GaN-based single crystal layer 23 on a main surface 21m of GaN-based buffer layer 21. Here, GaN-based buffer layer 21 refers to a layer low in crystallinity or non-crystalline, that is a part of GaN-based film 20 and grown at a temperature lower than a growth temperature of GaN-based single crystal layer 23 which is another part of GaN-based film 20.

By forming GaN-based buffer layer 21, unmatch in lattice constant between GaN-based single crystal layer 23 formed on GaN-based buffer layer 21 and single crystal film 13 is mitigated, and hence crystallinity of GaN-based single crystal layer 23 improves and dislocation density thereof is lowered. Consequently, crystallinity of GaN-based film 20 improves and dislocation density thereof is lowered.

GaN-based single crystal layer 23 can also be grown as GaN-based film 20 on single crystal film 13, without growing GaN-based buffer layer 21. Such a method is suitable for a case where unmatch in lattice constant between single crystal film 13 and GaN-based film 20 formed thereon is less.

EXAMPLES

Example 1

1. Measurement of Coefficient of Thermal Expansion of GaN Crystal

A sample for evaluation having a size of 2×2×20 mm (having the a axis in a longitudinal direction and having any of a c plane and an m plane as a plane in parallel to the longitudinal direction, with accuracy in plane orientation being within ±0.1°) was cut from GaN single crystal grown with the HVPE method and having dislocation density of $1\times10^6$ cm$^{-2}$, Si concentration of $1\times10^{18}$ cm$^2$, oxygen concentration of $1\times10^{17}$ cm$^{-2}$, and carbon concentration of $1\times10^{16}$ cm$^{-2}$.

An average coefficient of thermal expansion of the sample for evaluation above when a temperature was increased from a room temperature (25° C.) to 800° C. was measured with TMA (thermomechanical analysis). Specifically, using TMA8310 manufactured by Rigaku Corporation, the coefficient of thermal expansion of the sample for evaluation was measured with differential dilatometry in an atmosphere in which a nitrogen gas flows. An average coefficient of thermal expansion $\alpha_{GaN\text{-}a}$ from 25° C. to 800° C. of GaN crystal in the direction of the a axis obtained by such measurement was $5.84\times10^6$/° C.

2. Step of Preparing Composite Substrate (1) Sub Step of Preparing Support Substrate Referring to FIG. 2(A), 13 types of commercially available $Al_2O_3$—$SiO_2$-based sintered bodies A to M were prepared by sintering a mixture of $Al_2O_3$ and $SiO_2$ at a prescribed molar ratio as a material for support substrate 11 at a pressure of 50 MPa in a direction of one axis in an argon gas atmosphere at 1700° C. for 1 hour. As a result of confirmation with X-ray diffraction, in each of these 13 types of $Al_2O_3$—$SiO_2$-based sintered bodies A to M, $Al_6O_{13}Si_2$ (mullite), $Al_2O_3$, and $SiO_2$ were present. In addition, a sample for measurement having a size of 2×2×20 mm (having a direction substantially parallel to the main surface of the support substrate cut from a sintered body as the longitudinal direction) was cut from each of the 13 types of the $Al_2O_3$—$SiO_2$-based sintered bodies above. Here, since the $Al_2O_3$—$SiO_2$-based sintered body does not have directional specificity, any cutting direction was set. An average coefficient of thermal expansion $\alpha_S$ of each of these samples for measurement when a temperature was increased from room temperature (25° C.) to 800° C. was measured as described above.

$Al_2O_3$—$SiO_2$-based sintered body A had a molar ratio between $Al_2O_3$ and $SiO_2$ of 53:47 and attained average coefficient of thermal expansion $\alpha_S$ from 25° C. to 800° C. (hereinafter simply referred to as average coefficient of thermal expansion $\alpha_S$) of $4.2\times10^{-6}$/° C., and a ratio of average coefficient of thermal expansion $\alpha_S$ of the sintered body to an average coefficient of thermal expansion $\alpha_{GaN\text{-}a}$ from 25° C. to 800° C. of the GaN crystal in the direction of a axis (hereinafter simply referred to as average coefficient of thermal expansion $\alpha_{GaN\text{-}a}$) (hereinafter denoted as an $\alpha_S/\alpha_{GaN\text{-}a}$ ratio) was 0.719. $Al_2O_3$—$SiO_2$-based sintered body B had a molar ratio between $Al_2O_3$ and $SiO_2$ of 45:55, and attained average coefficient of thermal expansion $\alpha_S$ of $4.7\times10^{-6}$/° C. and the $\alpha_S/\alpha_{GaN\text{-}a}$ ratio of 0.805. $Al_2O_3$—$SiO_2$-based sintered body C had a molar ratio between $Al_2O_3$ and $SiO_2$ of 40:60, and attained average coefficient of thermal expansion $\alpha_S$ of $5.2\times10^{-6}$/° C. and the $\alpha_S/\alpha_{GaN\text{-}a}$ ratio of 0.890. $Al_2O_3$—$SiO_2$-based sintered body D had a molar ratio between $Al_2O_3$ and $SiO_2$ of 36:64, and attained average coefficient of thermal expansion $\alpha_S$ of $5.4\times10^{-6}$/° C. and the $\alpha_S/\alpha_{GaN\text{-}a}$ ratio of 0.925. $Al_2O_3$—$SiO_2$-based sintered body E had a molar ratio between $Al_2O_3$ and $SiO_2$ of 35:65, and attained average coefficient of thermal expansion $a_s$ of $5.5\times10^{-6}$/° C. and the $\alpha_S/\alpha_{GaN\text{-}a}$ ratio of 0.942. $Al_2O_3$—$SiO_2$-based sintered body F had a molar ratio between $Al_2O_3$ and $SiO_2$ of 34:66, and attained average coefficient of thermal expansion $\alpha_S$ of $5.6\times10^{-6}$/° C. and the $\alpha_S/\alpha_{GaN}$, ratio of 0.959. $Al_2O_3$—$SiO_2$-based sintered body G had a molar ratio between $Al_2O_3$ and $SiO_2$ of 32:68, and attained average coefficient of thermal expansion $\alpha_S$ of $5.7\times10^{-6}$/° C. and the $\alpha_S/\alpha_{GaN\text{-}a}$ ratio of 0.976. $Al_2O_3$—$SiO_2$-based sintered body H had a molar ratio between $Al_2O_3$ and $SiO_2$ of 26:74, and attained average coefficient of thermal expansion $\alpha_S$ of $6.1\times10^{-6}$/° C. and the $\alpha_S/\alpha_{GaN\text{-}a}$ ratio of 1.045. $Al_2O_3$—$SiO_2$-based sintered body I had a molar ratio between $Al_2O_3$ and $SiO_2$ of 24:76, and attained average coefficient of thermal expansion $\alpha_S$ of $6.4\times10^{-6}$/° C. and the $\alpha_S/\alpha_{GaN}$, ratio of 1.096. $Al_2O_3$—$SiO_2$-based sintered body J had a molar ratio between $Al_2O_3$ and $SiO_2$ of 20:80, and attained average coefficient of thermal expansion $\alpha_S$ of $6.6\times10^{-6}$/° C. and the $\alpha_S/\alpha_{GaN\text{-}a}$ ratio of 1.130. $Al_2O_3$—$SiO_2$-based sintered body K had a molar ratio between $Al_2O_3$ and $SiO_2$ of 16:84, and attained average coefficient of thermal expansion $\alpha_S$ of $7.0\times10^{-6}$/° C. and the $\alpha_S/\alpha_{GaN\text{-}a}$ ratio of 1.199. $Al_2O_3$—$SiO_2$-based sintered body L had a molar ratio between $Al_2O_3$ and $SiO_2$ of 14:86, and attained average coefficient of thermal expansion $\alpha_S$ of $7.2\times10^{-6}$/° C. and the $\alpha_S/\alpha_{GaN\text{-}a}$ ratio of 1.233. $Al_2O_3$—$SiO_2$-based sintered body M had a molar ratio between $Al_2O_3$ and $SiO_2$ of 9:91, and attained average coefficient of thermal expansion $\alpha_S$ of $7.5\times10^{-6}$/° C. and the $\alpha_S/\alpha_{GaN\text{-}a}$ ratio of 1.284.

A support substrate having a diameter of 4 inches (101.6 mm) and a thickness of 1 mm was cut from each of the 13 types of $Al_2O_3$—$SiO_2$-based sintered bodies A to M above, and opposing main surfaces of each support substrate were mirror-polished to thereby obtain support substrates A to M. Namely, an average coefficient of thermal expansion of each of support substrates A to M from 25° C. to 800° C. was equal to an average coefficient of thermal expansion of each corresponding one of $Al_2O_3$—$SiO_2$-based sintered bodies A to M from 25° C. to 800° C. Table 1 summarizes the results.

(2) Sub Step of Forming Single Crystal Film on Underlying Substrate

Referring to FIG. 2(B), an Si substrate having a mirror-polished (111) plane as main surface 30n and having a diameter of 5 inches (127 mm) and a thickness of 0.5 mm was prepared as underlying substrate 30.

An SiC film having a thickness of 0.4 μM was formed as single crystal film 13 on main surface 30n of the Si substrate (underlying substrate 30) above with a CVD (chemical vapor deposition) method. Regarding film formation conditions, an $SiH_4$ gas and a $C_3H_8$ gas were used as source gases, an $H_2$ gas was used as a carrier gas, a film formation temperature was set to 1300° C., and a film formation pressure was set to an atmospheric pressure. Main surface 13m of the SiC film (single crystal film 13) thus obtained had a plane orientation having an off angle within ±1° with respect to the (0001) plane, and included an Si atomic plane (a (0001) plane) and a C atomic plane (a (000-1) plane) as mixed like mosaic.

(3) Sub Step of Bonding Support Substrate and Single Crystal Film to Each Other

Referring to (C1) in FIG. 2(C), an $SiO_2$ film having a thickness of 2 μm was formed on main surface 11m of each of support substrates A to M (support substrate 11) in FIG. 2(A) with the CVD method. Then, by polishing the $SiO_2$ film having a thickness of 2 μm on main surface 11m of each of support substrates A to M (support substrate 11) with $CeO_2$ slurry, only an $SiO_2$ layer having a thickness of 0.2 μm was allowed to remain to serve as adhesive layer 12a. Thus, pores in main surface 11m of each of support substrates A to M (support substrate 11) were buried to thereby obtain the $SiO_2$ layer (adhesive layer 12a) having flat main surface 12am and a thickness of 0.2 μm.

Referring also to (C2) in FIG. 2(C), main surface 13n of the SiC film (single crystal film 13) formed on the Si substrate (underlying substrate 30) in FIG. 2(B) was oxidized in an oxygen atmosphere at 1000° C. to thereby form an $SiO_2$ layer (adhesive layer 12b) having a thickness of 0.2 μm on main surface 13n of the SiC film (single crystal film 13).

Referring next to (C3) in FIG. 2(C), main surface 12am of the $SiO_2$ layer (adhesive layer 12a) formed on each of support substrates A to M (support substrate 11) and main surface 12bn of the $SiO_2$ layer (adhesive layer 12b) formed on the SiC film (single crystal film 13) formed on the Si substrate (underlying substrate 30) were cleaned and activated by argon plasma, and thereafter main surface 12am of the $SiO_2$ layer (adhesive layer 12a) and main surface 12bn of the $SiO_2$ layer (adhesive layer 12b) were bonded to each other, followed by heat treatment for 2 hours in a nitrogen atmosphere at 300° C.

(4) Sub Step of Removing Underlying Substrate

Referring to FIG. 2(D), a main surface on a back side (a side where single crystal film 13 was not bonded) and a side surface of each of support substrates A to M (support substrate 11) were covered and protected with wax 40, and thereafter the Si substrate (underlying substrate 30) was removed by etching using a mixed acid aqueous solution of hydrofluoric acid (hydrogen fluoride) and nitric acid. Thus, composite substrates A to M in which SiC films (single crystal films 13) were arranged on the main surface 11m sides of support substrates A to M (support substrates 11) respectively were obtained.

3. Step of Forming GaN-Based Film

Referring to FIG. 1(B), a GaN film (GaN-based film 20) was formed with the MOCVD method on main surface 13m of the SiC film (single crystal film 13) of each of composite substrates A to M (composite substrate 10) (such a main surface being a (0001) plane, a (000-1) plane, or these planes as mixed) and on a main surface of a sapphire substrate having a diameter of 4 inches (101.6 mm) and a thickness of 1 mm (such a main surface being a (0001) plane). In forming the GaN film (GaN-based film 20), a TMG (trimethylgallium) gas and an $NH_3$ gas were used as source gases, an $H_2$ gas was used as a carrier gas, and a GaN buffer layer (GaN-based buffer layer 21) was grown to a thickness of 0.1 μm at 500° C. and then a GaN single crystal layer (GaN-based single crystal layer 23) was grown to a thickness of 5 μm at 1050° C. Here, a rate of growth of the GaN single crystal layer was 1 μm/hr. Thereafter, wafers A to M and R in which GaN films were formed on composite substrates A to M and the sapphire substrate respectively were cooled to room temperature (25° C.) at a rate of 10° C./min.

Regarding wafers A to M and R taken out of a film formation apparatus after cooling to room temperature, warpage of the wafer and crack count and dislocation density of the GaN film were determined. Here, a shape of warpage and an amount of warpage of the wafer were determined based on interference fringes observed at the main surface of the GaN film with FM200E Wafer of Corning Tropel. Regarding crack count in the GaN film, the number of cracks per unit length was counted with a Nomarski microscope, and evaluation as "extremely few", "few", "many", and "extremely many" was made when the count was smaller than 1 count/mm, when the count was not smaller than 1 count/mm and smaller than 5 counts/mm, when the count was not smaller than 5 counts/mm and smaller than 10 counts/mm, and when the count was not smaller than 10 counts/mm, respectively. Dislocation density of the GaN film was measured with CL (cathode luminescence) based on the number of dark points per unit area. It is noted that cracks generated in the GaN film in the present Example were small without penetrating the film.

Wafer A warped on the GaN film side in a recessed manner, an amount of warpage was 700 μm, and cracks counted in the GaN film were extremely many. Wafer B warped on the GaN film side in a recessed manner, an amount of warpage was 650 μm, cracks counted in the GaN film were few, and dislocation density of the GaN film was $4\times10^8$ cm$^{-2}$. Wafer C warped on the GaN film side in a recessed manner, an amount of warpage was 400 μm, cracks counted in the GaN film were few, and dislocation density of the GaN film was $3\times10^8$ cm$^{-2}$. Wafer D warped on the GaN film side in a recessed manner, an amount of warpage was 350 μm, cracks counted in the GaN film were few, and dislocation density of the GaN film was $2.5\times10^8$ cm$^{-2}$. Wafer E warped on the GaN film side in a recessed manner, an amount of warpage was 320 μm, cracks counted in the GaN film were few, and dislocation density of the GaN film was $2\times10^8$ cm$^{-2}$. Wafer F warped on the GaN film side in a recessed manner, an amount of warpage was 230 μm, cracks counted in the GaN film were extremely few, and dislocation density of the GaN film was $1\times10^8$ cm$^2$. Wafer G warped on the GaN film side in a recessed manner, an amount of warpage was 200 μm, cracks counted in the GaN film were extremely few, and dislocation density of the GaN film was $1\times10^8$ cm$^{-2}$. Wafer H warped on the GaN film side in a recessed manner, an amount of warpage was 10 μm, cracks counted in the GaN film were extremely few, and dislocation density of the GaN film was $1\times10^8$ cm$^{-2}$. Wafer I warped on the GaN film side in a projecting manner, an amount of warpage was 20 μm, cracks counted in the GaN film were extremely few, and dislocation density of the GaN film was $1\times10^8$ cm$^{-2}$. Wafer J warped on the GaN film side in a projecting manner, an amount of warpage was 110 μm, cracks counted in the GaN film were few, and dislocation density of the GaN film was $2\times10^8$ cm$^{-2}$. Wafer K warped on the GaN film side in a projecting manner, an amount of warpage was 230 μm, cracks counted in the GaN film were few, and dislocation density of the GaN film was $3\times10^8$ cm$^{-2}$. Wafer L warped on the GaN film side in a projecting manner, an amount of warpage was 740 μm, cracks counted in the GaN film were few, and dislocation density of the GaN film was $4\times10^8$ cm$^2$. In wafer M, cracking occurred in support substrate M and a sufficient GaN film was not obtained. Wafer R warped on the GaN film side in a projecting manner, an amount of warpage was 750 μm, cracks counted in the GaN film were few, and dislocation density of the GaN film was $4\times10^8$ cm$^2$. Table 1 summarizes these results. In Table 1, "-" indicates that that physical property value was not measured.

coefficient of thermal expansion $\alpha_{GaN\text{-}a}$ of the GaN crystal in the direction of a axis (wafers F to I).

Example 2

1. Measurement of Coefficient of Thermal Expansion of GaN Crystal

Measurement as in Example 1 was conducted and then average coefficient of thermal expansion $\alpha_{GaN\text{-}a}$ of the GaN crystal in the direction of a axis from 25° C. to 800° C. was $5.84\times10^{-6}$/° C.

TABLE 1

| | | Wafer A | Wafer B | Wafer C | Wafer D | Wafer E | Wafer F | Wafer G | Wafer H |
|---|---|---|---|---|---|---|---|---|---|
| Composite Substrate | Coefficient of Thermal Expansion $\alpha_S$ ($10^{-6}$/° C.) | 4.2 | 4.7 | 5.2 | 5.4 | 5.5 | 5.6 | 5.7 | 6.1 |
| | $\alpha_S/\alpha_{GaN\text{-}a}$ Ratio | 0.719 | 0.805 | 0.890 | 0.925 | 0.942 | 0.959 | 0.976 | 1.045 |
| Wafer | Shape of Warpage [GaN Film Side] | Recess | Recess | Recess | Recess | Recess | Recess | Recess | Recess |
| | Amount of Warpage [GaN Film] (μm) | 700 | 650 | 400 | 350 | 320 | 230 | 200 | 10 |
| | Crack Count in GaN Film | Extremely many | Few | Few | Few | Few | Extremely few | Extremely few | Extremely few |
| | Dislocation Density of GaN Film ($10^8$ cm$^{-2}$) | — | 4 | 3 | 2.5 | 2 | 1 | 1 | 1 |
| | Notes | | | | | | | | |

| | | Wafer I | Wafer J | Wafer K | Wafer L | Wafer M | Wafer R |
|---|---|---|---|---|---|---|---|
| Composite Substrate | Coefficient of Thermal Expansion $\alpha_S$ ($10^{-6}$/° C.) | 6.4 | 6.6 | 7.0 | 7.2 | 7.5 | — |
| | $\alpha_S/\alpha_{GaN\text{-}a}$ Ratio | 1.096 | 1.130 | 1.199 | 1.233 | 1.284 | — |
| Wafer | Shape of Warpage [GaN Film Side] | Projection | Projection | Projection | Projection | — | Projection |
| | Amount of Warpage [GaN Film] (μm) | 20 | 110 | 230 | 740 | — | 750 |
| | Crack Count in GaN Film | Extremely few | Few | Few | Few | — | Few |
| | Dislocation Density of GaN Film ($10^8$ cm$^{-2}$) | 1 | 2 | 3 | 4 | — | 4 |
| | Notes | | | | | Crack in Support Substrate | |

Referring to Table 1, by employing a composite substrate (wafers B to K) having a support substrate in which coefficient of thermal expansion $\alpha_S$ in a main surface was more than 0.8 time and less than 1.2 times (that is, $0.8<(\alpha_S/\alpha_{GaN\text{-}a}$ ratio)$<1.2$) as high as coefficient of thermal expansion $\alpha_{GaN\text{-}a}$ of GaN crystal in the direction of a axis, as compared with a case where a sapphire substrate was employed (wafer R), a GaN film extremely less in warpage could be formed. In addition, from a point of view of further decrease in warpage and dislocation density of the GaN film in the wafer, coefficient of thermal expansion $\alpha_S$ in a main surface of the support substrate of the composite substrate was preferably more than 0.9 time and less than 1.15 times (that is, $0.9<(\alpha_S/\alpha_{GaN\text{-}a}$ ratio)$<1.15$) as high as coefficient of thermal expansion $\alpha_{GaN\text{-}a}$ of the GaN crystal in the direction of a axis (wafers D to J) and further preferably more than 0.95 time and less than 1.10 times (that is, $0.95<(\alpha_S/\alpha_{GaN\text{-}a}$ ratio)$<1.10$) as high as 2. Step of Preparing Composite Substrate (1) Sub Step of Preparing Support Substrate Referring to FIG. 2(A), 57 types of YSZ (yttria stabilized zirconia)-mullite-based sintered bodies A0, B1 to B8, C1 to C8, D1 to D8, E1 to E8, F1 to F8, G1 to G8, and H1 to H8 as a material for support substrate 11, manufactured with atmospheric-pressure sintering of sintering at 1 atmosphere at 1700° C. for 10 hours and HIP (hot isostatic pressing) of sintering at 2000 atmospheres at 1700° C. for 1 hour, were subjected to X-ray diffraction, to confirm presence and a ratio of $Y_2O_3$, $ZrO_2$, and mullite ($3Al_2O_3.2SiO_2$ to $2Al_2O_3.SiO_2$, specifically $Al_6O_{13}Si_2$). In addition, a sample for measurement having a size of $2\times2\times20$ mm (having a direction substantially parallel to the main surface of the support substrate cut from a sintered body as the longitudinal direction) was cut from each of the 57 types of the YSZ-mullite-based sintered bodies above. Here, since the YSZ-mullite-based sintered body does not have directional specificity, any cutting direction was set. Average coefficient of thermal expansion $\alpha_S$ of each of these samples for measurement when a temperature was increased from a room temperature (25° C.) to 800° C. was measured as described above.

YSZ-mullite-based sintered body A0 had a content of YSZ to the total of YSZ and mullite (hereinafter referred to as a YSZ content) of 0 mass %, average coefficient of thermal expansion $\alpha_S$ from 25° C. to 800° C. (hereinafter simply referred to as average coefficient of thermal expansion $\alpha_S$) thereof was not measured, and a ratio of coefficient of thermal expansion $\alpha_S$ of the sintered body to average coefficient of thermal expansion $\alpha_{GaN-a}$ of the GaN crystal in the direction of a axis (hereinafter simply referred to as average coefficient of thermal expansion $\alpha_{GaN-a}$) (hereinafter denoted as the $\alpha_S/\alpha_{GaN-a}$ ratio) was not calculated.

YSZ-mullite-based sintered body B1 had a YSZ content of 20 mass %, a content of $Y_2O_3$ (yttria) to YSZ (hereinafter referred to as a $Y_2O_3$ content) of 0 mol %, average coefficient of thermal expansion $\alpha_S$ of $4.40 \times 10^{-6}$/° C., and the $\alpha_S/\alpha_{GaN-a}$ ratio of 0.753. YSZ-mullite-based sintered body B2 had a YSZ content of 20 mass %, a $Y_2O_3$ content of 3 mol %, average coefficient of thermal expansion $\alpha_S$ of $4.58 \times 10^{-6}$/° C., and the $\alpha_S/\alpha_{GaN-a}$ ratio of 0.784. YSZ-mullite-based sintered body B3 had a YSZ content of 20 mass %, a $Y_2O_3$ content of 5 mol %, average coefficient of thermal expansion $\alpha_S$ of $4.68 \times 10^{-6}$/° C., and the $\alpha_S/\alpha_{GaN-a}$ ratio of 0.801. YSZ-mullite-based sintered body B4 had a YSZ content of 20 mass %, a $Y_2O_3$ content of 6 mol %, average coefficient of thermal expansion $\alpha_S$ of $4.69 \times 10^{-6}$/° C., and the $\alpha_S/\alpha_{GaN-a}$ ratio of 0.803. YSZ-mullite-based sintered body B5 had a YSZ content of 20 mass %, a $Y_2O_3$ content of 10 mol %, average coefficient of thermal expansion $\alpha_S$ of $4.72 \times 10^{-6}$/° C., and the $\alpha_S/\alpha_{GaN-a}$ ratio of 0.808. YSZ-mullite-based sintered body B6 had a YSZ content of 20 mass %, a $Y_2O_3$ content of 20 mol %, average coefficient of thermal expansion $\alpha_S$ of $4.81 \times 10^{-6}$/° C., and the $\alpha_S/\alpha_{GaN-a}$ ratio of 0.823. YSZ-mullite-based sintered body B7 had a YSZ content of 20 mass %, a $Y_2O_3$ content of 50 mol %, average coefficient of thermal expansion $\alpha_S$ of $5.06 \times 10^{-6}$/° C., and the $\alpha_S/\alpha_{GaN}$ ratio of 0.866. YSZ-mullite-based sintered body B8 had a YSZ content of 20 mass %, a $Y_2O_3$ content of 100 mol %, average coefficient of thermal expansion $\alpha_S$ was not measured, and the $\alpha_S/\alpha_{GaN}$ ratio was not calculated.

YSZ-mullite-based sintered body C1 had a YSZ content of 25 mass %, a $Y_2O_3$ content of 0 mol %, average coefficient of thermal expansion $\alpha_S$ of $4.48 \times 10^{-6}$/° C., and the $\alpha_S/\alpha_{GaN}$ ratio of 0.767. YSZ-mullite-based sintered body C2 had a YSZ content of 25 mass %, a $Y_2O_3$ content of 3 mol %, average coefficient of thermal expansion $\alpha_S$ of $4.62 \times 10^{-6}$/° C., and the $\alpha_S/\alpha_{GaN}$ ratio of 0.791. YSZ-mullite-based sintered body C3 had a YSZ content of 25 mass %, a $Y_2O_3$ content of 5 mol %, average coefficient of thermal expansion $\alpha_S$ of $5.26 \times 10^{-6}$/° C., and the $\alpha_S/\alpha_{GaN}$ ratio of 0.901. YSZ-mullite-based sintered body C4 had a YSZ content of 25 mass %, a $Y_2O_3$ content of 6 mol %, average coefficient of thermal expansion $\alpha_S$ of $5.27 \times 10^{-6}$/° C., and the $\alpha_S/\alpha_{GaN-a}$ ratio of 0.903. YSZ-mullite-based sintered body C5 had a YSZ content of 25 mass %, a $Y_2O_3$ content of 10 mol %, average coefficient of thermal expansion $\alpha_S$ of $5.31 \times 10^{-6}$/° C., and the $\alpha_S/\alpha_{GaN-a}$ ratio of 0.909. YSZ-mullite-based sintered body C6 had a YSZ content of 25 mass %, a $Y_2O_3$ content of 20 mol %, average coefficient of thermal expansion $\alpha_S$ of $5.40 \times 10^{-6}$/° C., and the $\alpha_S/\alpha_{GaN-a}$ ratio of 0.925. YSZ-mullite-based sintered body C7 had a YSZ content of 25 mass %, a $Y_2O_3$ content of 50 mol %, average coefficient of thermal expansion $\alpha_S$ of $5.69 \times 10^{-6}$/° C., and the $\alpha_S/\alpha_{GaN-a}$ ratio of 0.974. YSZ-mullite-based sintered body C8 had a YSZ content of 25 mass %, a $Y_2O_3$ content of 100 mol %, average coefficient of thermal expansion $\alpha_S$ was not measured, and the $\alpha_S/\alpha_{GaN-a}$ ratio was not calculated.

YSZ-mullite-based sintered body D1 had a YSZ content of 30 mass %, a $Y_2O_3$ content of 0 mol %, average coefficient of thermal expansion $\alpha_S$ of $4.56 \times 10^{-6}$/° C., and the $\alpha_S/\alpha_{GaN}$ ratio of 0.781. YSZ-mullite-based sintered body D2 had a YSZ content of 30 mass %, a $Y_2O_3$ content of 3 mol %, average coefficient of thermal expansion $\alpha_S$ of $4.65 \times 10^{-6}$/° C., and the $\alpha_S/\alpha_{GaN}$ ratio of 0.796. YSZ-mullite-based sintered body D3 had a YSZ content of 30 mass %, a $Y_2O_3$ content of 5 mol %, average coefficient of thermal expansion $\alpha_S$ of $5.55 \times 10^{-6}$/° C., and the $\alpha_S/\alpha_{GaN-a}$ ratio of 0.950. YSZ-mullite-based sintered body D4 had a YSZ content of 30 mass %, a $Y_2O_3$ content of 6 mol %, average coefficient of thermal expansion $\alpha_S$ of $5.56 \times 10^{-6}$/° C., and the $\alpha_S/\alpha_{GaN}$ ratio of 0.952. YSZ-mullite-based sintered body D5 had a YSZ content of 30 mass %, a $Y_2O_3$ content of 10 mol %, average coefficient of thermal expansion $\alpha_S$ of $5.60 \times 10^{-6}$/° C., and the $\alpha_S/\alpha_{GaN}$ ratio of 0.959. YSZ-mullite-based sintered body D6 had a YSZ content of 30 mass %, a $Y_2O_3$ content of 20 mol %, average coefficient of thermal expansion $\alpha_S$ of $5.70 \times 10^{-6}$/° C., and the $\alpha_S/\alpha_{GaN-a}$ ratio of 0.976. YSZ-mullite-based sintered body D7 had a YSZ content of 30 mass %, a $Y_2O_3$ content of 50 mol %, average coefficient of thermal expansion $\alpha_S$ of $6.00 \times 10^{-6}$/° C., and the $\alpha_S/\alpha_{GaN-a}$ ratio of 1.027. YSZ-mullite-based sintered body D8 had a YSZ content of 30 mass %, a $Y_2O_3$ content of 100 mol %, average coefficient of thermal expansion $\alpha_S$ was not measured, and the $\alpha_S/\alpha_{GaN-a}$ ratio was not calculated.

YSZ-mullite-based sintered body E1 had a YSZ content of 35 mass %, a $Y_2O_3$ content of 0 mol %, average coefficient of thermal expansion $\alpha_S$ of $4.77 \times 10^{-6}$/° C., and the $\alpha_S/\alpha_{GaN-a}$ ratio of 0.816. YSZ-mullite-based sintered body E2 had a YSZ content of 35 mass %, a $Y_2O_3$ content of 3 mol %, average coefficient of thermal expansion $\alpha_S$ of $4.86 \times 10^{-6}$/° C., and the $\alpha_S/\alpha_{GaN-a}$ ratio of 0.832. YSZ-mullite-based sintered body E3 had a YSZ content of 35 mass %, a $Y_2O_3$ content of 5 mol %, average coefficient of thermal expansion $\alpha_S$ of $5.80 \times 10^{-6}$/° C., and the $\alpha_S/\alpha_{GaN-a}$ ratio of 0.993. YSZ-mullite-based sintered body E4 had a YSZ content of 35 mass %, a $Y_2O_3$ content of 6 mol %, average coefficient of thermal expansion $\alpha_S$ of $5.81 \times 10^{-6}$/° C., and the $\alpha_S/\alpha_{GaN-a}$ ratio of 0.995. YSZ-mullite-based sintered body E5 had a YSZ content of 35 mass %, a $Y_2O_3$ content of 10 mol %, average coefficient of thermal expansion $\alpha_S$ of $5.85 \times 10^{-6}$/° C., and the $\alpha_S/\alpha_{GaN-a}$ ratio of 1.002. YSZ-mullite-based sintered body E6 had a YSZ content of 35 mass %, a $Y_2O_3$ content of 20 mol %, average coefficient of thermal expansion $\alpha_S$ of $5.96 \times 10^{-6}$/° C., and the $\alpha_S/\alpha_{GaN-a}$ ratio of 1.020. YSZ-mullite-based sintered body E7 had a YSZ content of 35 mass %, a $Y_2O_3$ content of 50 mol %, average coefficient of thermal expansion $\alpha_S$ of $6.27 \times 10^{-6}$/° C., and the $\alpha_S/\alpha_{GaN-a}$ ratio of 1.074. YSZ-mullite-based sintered body E8 had a YSZ content of 35 mass %, a $Y_2O_3$ content of 100 mol %, average coefficient of thermal expansion $\alpha_S$ was not measured, and the $\alpha_S/\alpha_{GaN-a}$ ratio was not calculated.

YSZ-mullite-based sintered body F2 had a YSZ content of 40 mass %, a $Y_2O_3$ content of 0 mol %, average coefficient of thermal expansion $\alpha_S$ of $4.97 \times 10^{-6}$/° C., and the $\alpha_S/\alpha_{GaN-a}$ ratio of 0.851. YSZ-mullite-based sintered body F2 had a YSZ content of 40 mass %, a $Y_2O_3$ content of 3 mol %, average coefficient of thermal expansion $\alpha_S$ of $5.07 \times 10^{-6}$/° C., and the $\alpha_S/\alpha_{GaN}$ ratio of 0.868. YSZ-mullite-based sintered body F3 had a YSZ content of 40 mass %, a $Y_2O_3$ content of 5 mol %, average coefficient of thermal expansion $\alpha_S$ of $6.05 \times$ $10^{-6}$/° C., and the $\alpha_S/\alpha_{GaN\text{-}a}$ ratio of 1.036. YSZ-mullite-based sintered body F4 had a YSZ content of 40 mass %, a $Y_2O_3$ content of 6 mol %, average coefficient of thermal expansion $\alpha_S$ of $6.06\times10^{-6}$/° C., and the $\alpha_S/\alpha_{GaN}$, ratio of 1.038. YSZ-mullite-based sintered body F5 had a YSZ content of 40 mass %, a $Y_2O_3$ content of 10 mol %, average coefficient of thermal expansion $\alpha_S$ of $6.10\times10^{-6}$/° C., and the $\alpha_S/\alpha_{GaN\text{-}a}$ ratio of 1.045. YSZ-mullite-based sintered body F6 had a YSZ content of 40 mass %, a $Y_2O_3$ content of 20 mol %, average coefficient of thermal expansion $\alpha_S$ of $6.21\times10^{-6}$/° C., and the $\alpha_S/\alpha_{GaN\text{-}a}$ ratio of 1.064. YSZ-mullite-based sintered body F7 had a YSZ content of 40 mass %, a $Y_2O_3$ content of 50 mol %, average coefficient of thermal expansion $\alpha_S$ of $6.54\times10^{-6}$/° C., and the $\alpha_S/\alpha_{GaN\text{-}a}$ ratio of 1.120. YSZ-mullite-based sintered body F8 had a YSZ content of 40 mass %, a $Y_2O_3$ content of 100 mol %, average coefficient of thermal expansion $\alpha_S$ was not measured, and the $\alpha_S/\alpha_{GaN\text{-}a}$ ratio was not calculated.

YSZ-mullite-based sintered body G1 had a YSZ content of 70 mass %, a $Y_2O_3$ content of 0 mol %, average coefficient of thermal expansion $\alpha_S$ of $4.99\times10^{-6}$/° C., and the $\alpha_S/\alpha_{GaN\text{-}a}$ ratio of 0.854. YSZ-mullite-based sintered body G2 had a YSZ content of 70 mass %, a $Y_2O_3$ content of 3 mol %, average coefficient of thermal expansion $\alpha_S$ of $5.09\times10^{-6}$/° C., and the $\alpha_S/\alpha_{GaN\text{-}a}$ ratio of 0.872. YSZ-mullite-based sintered body G3 had a YSZ content of 70 mass %, a $Y_2O_3$ content of 5 mol %, average coefficient of thermal expansion $\alpha_S$ of $6.07\times10^{-6}$/° C., and the $\alpha_S/\alpha_{GaN\text{-}a}$ ratio of 1.039. YSZ-mullite-based sintered body G4 had a YSZ content of 70 mass %, a $Y_2O_3$ content of 6 mol %, average coefficient of thermal expansion $\alpha_S$ of $6.08\times10^{-6}$/° C., and the $\alpha_S/\alpha_{GaN\text{-}a}$ ratio of 1.041. YSZ-mullite-based sintered body G5 had a YSZ content of 70 mass %, a $Y_2O_3$ content of 10 mol %, average coefficient of thermal expansion $\alpha_S$ of $6.12\times10^{-6}$/° C., and the $\alpha_S/\alpha_{GaN\text{-}a}$ ratio of 1.048. YSZ-mullite-based sintered body G6 had a YSZ content of 70 mass %, a $Y_2O_3$ content of 20 mol %, average coefficient of thermal expansion $\alpha_S$ of $6.23\times10^{-6}$/° C., and the $\alpha_S/\alpha_{GaN\text{-}a}$ ratio of 1.067. YSZ-mullite-based sintered body G7 had a YSZ content of 70 mass %, a $Y_2O_3$ content of 50 mol %, average coefficient of thermal expansion $\alpha_S$ of $6.56\times10^{-6}$/° C., and the $\alpha_S/\alpha_{GaN\text{-}a}$ ratio of 1.123. YSZ-mullite-based sintered body G8 had a YSZ content of 70 mass %, a $Y_2O_3$ content of 100 mol %, average coefficient of thermal expansion $\alpha_S$ was not measured, and the $\alpha_S/\alpha_{GaN\text{-}a}$ ratio was not calculated.

YSZ-mullite-based sintered body H1 had a YSZ content of 100 mass %, a $Y_2O_3$ content of 0 mol %, average coefficient of thermal expansion $\alpha_S$ was not measured, and the $\alpha_S/\alpha_{GaN\text{-}a}$ ratio was not calculated. YSZ-mullite-based sintered body H2 had a YSZ content of 100 mass %, a $Y_2O_3$ content of 3 mol %, average coefficient of thermal expansion $\alpha_S$ was not measured, and the $\alpha_S/\alpha_{GaN\text{-}a}$ ratio was not calculated. YSZ-mullite-based sintered body H3 had a YSZ content of 100 mass %, a $Y_2O_3$ content of 5 mol %, average coefficient of thermal expansion $\alpha_S$ was not measured, and the $\alpha_S/\alpha_{GaN\text{-}a}$ ratio was not calculated. YSZ-mullite-based sintered body H4 had a YSZ content of 100 mass %, a $Y_2O_3$ content of 6 mol %, average coefficient of thermal expansion $\alpha_S$ was not measured, and the $\alpha_S/\alpha_{GaN\text{-}a}$ ratio was not calculated. YSZ-mullite-based sintered body H5 had a YSZ content of 100 mass %, a $Y_2O_3$ content of 10 mol %, average coefficient of thermal expansion $\alpha_S$ was not measured, and the $\alpha_S/\alpha_{GaN\text{-}a}$ ratio was not calculated. YSZ-mullite-based sintered body H6 had a YSZ content of 100 mass %, a $Y_2O_3$ content of 20 mol %, average coefficient of thermal expansion $\alpha_S$ was not measured, and the $\alpha_S/\alpha_{GaN\text{-}a}$ ratio was not calculated. YSZ-mullite-based sintered body H7 had a YSZ content of 100 mass %, a $Y_2O_3$ content of 50 mol %, average coefficient of thermal expansion $\alpha_S$ was not measured, and the $\alpha_S/\alpha_{GaN\text{-}a}$ ratio was not calculated. YSZ-mullite-based sintered body H8 had a YSZ content of 100 mass %, a $Y_2O_3$ content of 100 mol %, average coefficient of thermal expansion $\alpha_S$ was not measured, and the $\alpha_S/\alpha_{GaN\text{-}a}$ ratio was not calculated.

A support substrate having a diameter of 4 inches (101.6 mm) and a thickness of 1 mm was cut from each of the 57 types of the YSZ-mullite-based sintered bodies above, and opposing main surfaces of each support substrate were mirror-polished to thereby obtain 57 types of support substrates A0, B1 to B8, C1 to C8, D1 to D8, E1 to E8, F1 to F8, G1 to G8, and H1 to H8. Namely, a content of YSZ to the total of YSZ and mullite (a YSZ content), a content of $Y_2O_3$ (yttria) to YSZ (a $Y_2O_3$ content), and an average coefficient of thermal expansion from 25° C. to 800° C. of the 57 types of the support substrates above were equal to a YSZ content, a $Y_2O_3$ content, and an average coefficient of thermal expansion from 25° C. to 800° C. of the 57 types of the YSZ-mullite-based sintered bodies above, respectively. Tables 2 to 8 summarize these results. In Tables 2 to 8, "-" indicates that that physical property value was not measured or calculated.

(2) Sub Step of Forming Single Crystal Film on Underlying Substrate

Referring to FIG. 2(B), an Si substrate having a mirror-polished (111) plane as main surface 30n and having a diameter of 5 inches (127 mm) and a thickness of 0.5 mm was prepared as underlying substrate 30.

A GaN film having a thickness of 0.4 µm was formed as single crystal film 13 on main surface 30n of the Si substrate (underlying substrate 30) above with the MOCVD method. Regarding film formation conditions, a TMG gas and an $NH_3$ gas were used as source gases, an $H_2$ gas was used as a carrier gas, a film formation temperature was set to 1000° C., and a film formation pressure was set to 1 atmosphere. Main surface 13m of the GaN film (single crystal film 13) thus obtained had a plane orientation having an off angle within ±1° with respect to the (0001) plane and it was a Ga atomic plane.

(3) Sub Step of Bonding Support Substrate and Single Crystal Film to Each Other

Referring to (C1) in FIG. 2(C), an $SiO_2$ film having a thickness of 300 nm was formed on main surface 11m of each of the 57 types of support substrates A0, B1 to B8, C1 to C8, D1 to D8, E1 to E8, F1 to F8, G1 to G8, and H1 to H8 (support substrate 11) in FIG. 2(A) with the CVD (chemical vapor deposition) method. Then, by polishing the $SiO_2$ film having a thickness of 300 nm on main surface 11m of each of the 57 types of support substrates (support substrate 11) above with $CeO_2$ slurry, only an $SiO_2$ layer having a thickness of 270 nm was allowed to remain to serve as adhesive layer 12a. Thus, pores in main surface 11m of each of the 57 types of the support substrates (support substrate 11) above were buried to thereby obtain the $SiO_2$ layer (adhesive layer 12a) having flat main surface 12 am and a thickness of 270 nm.

Referring also to (C2) in FIG. 2(C), an $SiO_2$ film having a thickness of 300 nm was formed on main surface 13n of the GaN film (single crystal film 13) formed on the Si substrate (underlying substrate 30) in FIG. 2(B) with the CVD method. Then, by polishing this $SiO_2$ film having a thickness of 300 nm with $CeO_2$ slurry, only an $SiO_2$ layer having a thickness of 270 nm was allowed to remain to serve as adhesive layer 12b.

Referring next to (C3) in FIG. 2(C), main surface 12am of the $SiO_2$ layer (adhesive layer 12a) formed on each of the 57 types of the support substrates (support substrate 11) above and main surface 12bn of the $SiO_2$ layer (adhesive layer 12b) formed on the GaN film (single crystal film 13) formed on the Si substrate (underlying substrate 30) were cleaned and activated by argon plasma, and thereafter main surface 12am of the SiO$_2$ layer (adhesive layer 12a) and main surface 12bn of the SiO$_2$ layer (adhesive layer 12b) were bonded to each other, followed by heat treatment for 2 hours in a nitrogen atmosphere at 300° C.

(4) Sub Step of Removing Underlying Substrate

Referring to FIG. 2(D), a main surface on a back side (a side where single crystal film 13 was not bonded) and a side surface of each of the 57 types of the support substrates (support substrate 11) above were covered and protected with wax 40, and thereafter the Si substrate (underlying substrate 30) was removed by etching using a mixed acid aqueous solution of 10 mass % of hydrofluoric acid (hydrogen fluoride) and 5 mass % of nitric acid. Thus, 57 types of composite substrates A0, B1 to B8, C1 to C8, D1 to D8, E1 to E8, F1 to F8, G1 to G8, and H1 to H8 (composite substrate 10) in which GaN films (single crystal films 13) were arranged on the main surface 11m sides of the 57 types of the support substrates (support substrates 11) above respectively were obtained.

3. Step of Forming GaN-Based Film

Referring to FIG. 1(B), a GaN film (GaN-based film 20) was formed with the MOCVD method on main surface 13m (such a main surface being a (0001) plane) of the GaN film (single crystal film 13) of each of the 57 types of the composite substrates (composite substrate 10) and on a main surface of a sapphire substrate having a diameter of 4 inches (101.6 mm) and a thickness of 1 mm (such a main surface being a (0001) plane). In forming the GaN film (GaN-based film 20), a TMG (trimethylgallium) gas and an NH$_3$ gas were used as source gases, an H$_2$ gas was used as a carrier gas, and a GaN buffer layer (GaN-based buffer layer 21) was grown to a thickness of 50 nm at 500° C. and then a GaN single crystal layer (GaN-based single crystal layer 23) was grown to a thickness of 50 nm at 1050° C. Here, a rate of growth of the GaN single crystal layer was 1 μm/hr. Thereafter, 57 types of wafers A0, B1 to B8, C1 to C8, D1 to D8, E1 to E8, F1 to F8, G1 to G8, and H1 to H8 in which GaN films were formed on the 57 types of the composite substrates above respectively were cooled to a room temperature (25° C.) at a rate of 10° C./min.

Regarding the 57 types of the wafers taken out of a film formation apparatus after cooling to a room temperature, warpage of the wafer and crack count and dislocation density of the GaN film were determined. Here, a shape of warpage and an amount of warpage of the wafer were determined based on interference fringes observed at the main surface of the GaN film with FM200E Wafer of Corning Tropel. Regarding crack count in the GaN film, the number of cracks per unit length was counted with a Nomarski microscope, and evaluation as "extremely few", "few", "many", and "extremely many" was made when the count was smaller than 1 count/mm, when the count was not smaller than 1 count/mm and smaller than 5 counts/mm, when the count was not smaller than 5 counts/mm and smaller than 10 counts/mm, and when the count was not smaller than 10 counts/mm, respectively. Dislocation density of the GaN film was measured with CL (cathode luminescence) based on the number of dark points per unit area. It is noted that cracks generated in the GaN film in the present Example were small without penetrating the film.

Wafer A0 was extremely many in cracks counted in the GaN film, and a shape of warpage, an amount of warpage, and dislocation density of the GaN film were not measured. Table 2 summarizes results.

Wafer B1 warped on the GaN film side in a recessed manner, an amount of warpage was 670 μm, cracks counted in the GaN film were many, and dislocation density of the GaN film was $5\times10^8$ cm$^{-2}$. Wafer B2 warped on the GaN film side in a recessed manner, an amount of warpage was 660 μm, cracks counted in the GaN film were many, and dislocation density of the GaN film was $5\times10^8$ cm$^{-2}$. Wafer B3 warped on the GaN film side in a recessed manner, an amount of warpage was 655 μm, cracks counted in the GaN film were few, and dislocation density of the GaN film was $2\times10^8$ cm$^{-2}$. Wafer B4 warped on the GaN film side in a recessed manner, an amount of warpage was 650 μm, cracks counted in the GaN film were few, and dislocation density of the GaN film was $2\times10^8$ cm$^{-2}$. Wafer B5 warped on the GaN film side in a recessed manner, an amount of warpage was 645 μm, cracks counted in the GaN film were few, and dislocation density of the GaN film was $2\times10^8$ cm$^{-2}$. Wafer B6 warped on the GaN film side in a recessed manner, an amount of warpage was 610 μm, cracks counted in the GaN film were few, and dislocation density of the GaN film was $2\times10^8$ cm$^{-2}$. Wafer B7 warped on the GaN film side in a recessed manner, an amount of warpage was 480 μm, cracks counted in the GaN film were few, and dislocation density of the GaN film was $2\times10^8$ cm$^{-2}$. Wafer B8 was few in cracks counted in the GaN film, and a shape of warpage, an amount of warpage, and dislocation density of the GaN film were not measured. Table 2 summarizes results.

Wafer C1 warped on the GaN film side in a recessed manner, an amount of warpage was 665 μm, cracks counted in the GaN film were many, and dislocation density of the GaN film was $5\times10^8$ cm$^{-2}$. Wafer C2 warped on the GaN film side in a recessed manner, an amount of warpage was 657 μm, cracks counted in the GaN film were many, and dislocation density of the GaN film was $5\times10^8$ cm$^{-2}$. Wafer C3 warped on the GaN film side in a recessed manner, an amount of warpage was 390 μm, cracks counted in the GaN film were few, and dislocation density of the GaN film was $2\times10^8$ cm$^{-2}$. Wafer C4 warped on the GaN film side in a recessed manner, an amount of warpage was 385 μm, cracks counted in the GaN film were few, and dislocation density of the GaN film was $2\times10^8$ cm$^{-2}$. Wafer C5 warped on the GaN film side in a recessed manner, an amount of warpage was 380 μm, cracks counted in the GaN film were few, and dislocation density of the GaN film was $2\times10^8$ cm$^{-2}$. Wafer C6 warped on the GaN film side in a recessed manner, an amount of warpage was 350 μm, cracks counted in the GaN film were few, and dislocation density of the GaN film was $2\times10^8$ cm$^{-2}$. Wafer C7 warped on the GaN film side in a recessed manner, an amount of warpage was 180 μm, cracks counted in the GaN film were extremely few, and dislocation density of the GaN film was $1\times10^8$ cm$^{-2}$. Wafer C8 was few in cracks counted in the GaN film, and a shape of warpage, an amount of warpage, and dislocation density of the GaN film were not measured. Table 3 summarizes results.

Wafer D1 warped on the GaN film side in a recessed manner, an amount of warpage was 660 μm, cracks counted in the GaN film were many, and dislocation density of the GaN film was $5\times10^8$ cm$^{-2}$. Wafer D2 warped on the GaN film side in a recessed manner, an amount of warpage was 650 μm, cracks counted in the GaN film were many, and dislocation density of the GaN film was $5\times10^8$ cm$^{-2}$. Wafer D3 warped on the GaN film side in a recessed manner, an amount of warpage was 250 μm, cracks counted in the GaN film were few, and dislocation density of the GaN film was $2\times10^8$ cm$^{-2}$. Wafer D4 warped on the GaN film side in a recessed manner, an amount of warpage was 240 μm, cracks counted in the GaN film were few, and dislocation density of the GaN film was $2\times10^8$ cm$^{-2}$. Wafer D5 warped on the GaN film side in a recessed manner, an amount of warpage was 230 μm, cracks counted in the GaN film were extremely few, and dislocation density of the GaN film was $1\times10^8$ cm$^{-2}$. Wafer D6 warped on the GaN film side in a recessed manner, an amount of warpage was 180 µm, cracks counted in the GaN film were extremely few, and dislocation density of the GaN film was $1\times10^8$ cm$^{-2}$. Wafer D7 warped on the GaN film side in a recessed manner, an amount of warpage was 10 µm, cracks counted in the GaN film were few, and dislocation density of the GaN film was $2\times10^8$ cm$^{-2}$. Wafer D8 was few in cracks counted in the GaN film, and a shape of warpage, an amount of warpage, and dislocation density of the GaN film were not measured. Table 4 summarizes results.

Wafer E1 warped on the GaN film side in a recessed manner, an amount of warpage was 630 µm, cracks counted in the GaN film were many, and dislocation density of the GaN film was $5\times10^8$ cm$^{-2}$. Wafer E2 warped on the GaN film side in a recessed manner, an amount of warpage was 520 µm, cracks counted in the GaN film were many, and dislocation density of the GaN film was $5\times10^8$ cm$^{-2}$. Wafer E3 warped on the GaN film side in a recessed manner, an amount of warpage was 150 µm, cracks counted in the GaN film were few, and dislocation density of the GaN film was $2\times10^8$ cm$^2$. Wafer E4 warped on the GaN film side in a recessed manner, an amount of warpage was 120 µm, cracks counted in the GaN film were extremely few, and dislocation density of the GaN film was $1\times10^8$ cm$^2$. Wafer E5 warped on the GaN film side in a recessed manner, an amount of warpage was 1 µm, cracks counted in the GaN film were extremely few, and dislocation density of the GaN film was $1\times10^8$ cm$^{-2}$. Wafer E6 warped on the GaN film side in a projecting manner, an amount of warpage was 7 µm, cracks counted in the GaN film were few, and dislocation density of the GaN film was $2\times10^8$ cm$^{-2}$. Wafer E7 warped on the GaN film side in a projecting manner, an amount of warpage was 12 µm, cracks counted in the GaN film were few, and dislocation density of the GaN film was $2\times10^8$ cm$^{-2}$. Wafer E8 was few in cracks counted in the GaN film, and a shape of warpage, an amount of warpage, and dislocation density of the GaN film were not measured. Table 5 summarizes results.

Wafer F1 warped on the GaN film side in a recessed manner, an amount of warpage was 500 µm, cracks counted in the GaN film were many, and dislocation density of the GaN film was $5\times10^8$ cm$^{-2}$. Wafer F2 warped on the GaN film side in a recessed manner, an amount of warpage was 480 µm, cracks counted in the GaN film were many, and dislocation density of the GaN film was $5\times10^8$ cm$^2$. Wafer F3 warped on the GaN film side in a projecting manner, an amount of warpage was 10 µm, cracks counted in the GaN film were few, and dislocation density of the GaN film was $2\times10^8$ cm$^{-2}$. Wafer F4 warped on the GaN film side in a projecting manner, an amount of warpage was 10 µm, cracks counted in the GaN film were few, and dislocation density of the GaN film was $2\times10^8$ cm$^{-2}$. Wafer F5 warped on the GaN film side in a projecting manner, an amount of warpage was 11 µm, cracks counted in the GaN film were few, and dislocation density of the GaN film was $2\times10^8$ cm$^{-2}$. Wafer F6 warped on the GaN film side in a projecting manner, an amount of warpage was 12 µm, cracks counted in the GaN film were few, and dislocation density of the GaN film was $2\times10^8$ cm$^{-2}$. Wafer F7 warped on the GaN film side in a projecting manner, an amount of warpage was 110 µm, cracks counted in the GaN film were few, and dislocation density of the GaN film was $2\times10^8$ cm$^2$. Wafer F8 was few in cracks counted in the GaN film, and a shape of warpage, an amount of warpage, and dislocation density of the GaN film were not measured. Table 6 summarizes results.

Wafer G1 warped on the GaN film side in a recessed manner, an amount of warpage was 510 µm, cracks counted in the GaN film were extremely many, and dislocation density of the GaN film was $5\times10^8$ cm$^{-2}$. Wafer G2 warped on the GaN film side in a recessed manner, an amount of warpage was 490 µm, cracks counted in the GaN film were extremely many, and dislocation density of the GaN film was $5\times10^8$ cm$^{-2}$. Wafer G3 warped on the GaN film side in a projecting manner, an amount of warpage was 10 µm, cracks counted in the GaN film were extremely many, and dislocation density of the GaN film was $2\times10^8$ cm$^{-2}$. Wafer G4 warped on the GaN film side in a projecting manner, an amount of warpage was 11 µm, cracks counted in the GaN film were extremely many, and dislocation density of the GaN film was $2\times10^8$ cm$^{-2}$. Wafer G5 warped on the GaN film side in a projecting manner, an amount of warpage was 11 µm, cracks counted in the GaN film were extremely many, and dislocation density of the GaN film was $2\times10^8$ cm$^{-2}$. Wafer G6 warped on the GaN film side in a projecting manner, an amount of warpage was 12 µm, cracks counted in the GaN film were extremely many, and dislocation density of the GaN film was $2\times10^8$ cm$^{-2}$. Wafer G7 warped on the GaN film side in a projecting manner, an amount of warpage was 110 µm, cracks counted in the GaN film were extremely many, and dislocation density of the GaN film was $2\times10^8$ cm$^{-2}$. Wafer G8 was extremely many in cracks counted in the GaN film, and a shape of warpage, an amount of warpage, and dislocation density of the GaN film were not measured. Table 7 summarizes results.

All of wafers H1 to H8 were extremely many in cracks counted in the GaN film, and a shape of warpage, an amount of warpage, and dislocation density of the GaN film were not measured. Table 8 summarizes results.

TABLE 2

| | | Wafer A0 | Wafer B1 | Wafer B2 | Wafer B3 | Wafer B4 | Wafer B5 | Wafer B6 | Wafer B7 | Wafer B8 |
|---|---|---|---|---|---|---|---|---|---|---|
| Composite Substrate | YSZ Content (Mass %) | 0 | 20 | 20 | 20 | 20 | 20 | 20 | 20 | 20 |
| | $Y_2O_3$ Content (Mol %) | 0 | 0 | 3 | 5 | 6 | 10 | 20 | 50 | 100 |
| | Coefficient of Thermal Expansion $\alpha_S$ ($10^{-6}$/° C.) | — | 4.40 | 4.58 | 4.68 | 4.69 | 4.72 | 4.81 | 5.06 | — |
| | $\alpha_S/\alpha_{GaN-a}$ Ratio | — | 0.753 | 0.784 | 0.801 | 0.803 | 0.808 | 0.823 | 0.866 | — |
| Wafer | Shape of Warpage [GaN Film Side] | — | Recess | Recess | Recess | Recess | Recess | Recess | Recess | — |
| | Amount of Warpage [GaN Film] (µm) | — | 670 | 660 | 655 | 650 | 645 | 610 | 480 | — |
| | Crack Count in GaN Film | Extremely many | Many | Many | Few | Few | Few | Few | Few | Few |
| | Dislocation Density of GaN Film ($10^8$ cm$^{-2}$) | — | 5 | 5 | 2 | 2 | 2 | 2 | 2 | — |
| | Notes | | | | | | | | | |

TABLE 3

|  |  | Wafer C1 | Wafer C2 | Wafer C3 | Wafer C4 | Wafer C5 | Wafer C6 | Wafer C7 | Wafer C8 |
|---|---|---|---|---|---|---|---|---|---|
| Composite Substrate | YSZ Content (Mass %) | 25 | 25 | 25 | 25 | 25 | 25 | 25 | 25 |
|  | $Y_2O_3$ Content (Mol %) | 0 | 3 | 5 | 6 | 10 | 20 | 50 | 100 |
|  | Coefficient of Thermal Expansion $\alpha_S$ ($10^{-6}/°C$.) | 4.48 | 4.62 | 5.26 | 5.27 | 5.31 | 5.40 | 5.69 | — |
|  | $\alpha_S/\alpha_{GaN-a}$ Ratio | 0.767 | 0.791 | 0.901 | 0.903 | 0.909 | 0.925 | 0.974 | — |
| Wafer | Shape of Warpage [GaN Film Side] | Recess | Recess | Recess | Recess | Recess | Recess | Recess | — |
|  | Amount of Warpage [GaN Film] (μm) | 665 | 657 | 390 | 385 | 380 | 350 | 180 | — |
|  | Crack Count in GaN Film | Many | Many | Few | Few | Few | Few | Extremely few | Few |
|  | Dislocation Density of GaN Film ($10^8$ cm$^{-2}$) | 5 | 5 | 2 | 2 | 2 | 2 | 1 | — |
|  | Notes |  |  |  |  |  |  |  |  |

TABLE 4

|  |  | Wafer D1 | Wafer D2 | Wafer D3 | Wafer D4 | Wafer D5 | Wafer D6 | Wafer D7 | Wafer D8 |
|---|---|---|---|---|---|---|---|---|---|
| Composite Substrate | YSZ Content (Mass %) | 30 | 30 | 30 | 30 | 30 | 30 | 30 | 30 |
|  | $Y_2O_3$ Content (Mol %) | 0 | 3 | 5 | 6 | 10 | 20 | 50 | 100 |
|  | Coefficient of Thermal Expansion $\alpha_S$ ($10^{-6}/°C$.) | 4.56 | 4.65 | 5.55 | 5.56 | 5.60 | 5.70 | 6.00 | — |
|  | $\alpha_S/\alpha_{GaN-a}$ Ratio | 0.781 | 0.796 | 0.950 | 0.952 | 0.959 | 0.976 | 1.027 | — |
| Wafer | Shape of Warpage [GaN Film Side] | Recess | Recess | Recess | Recess | Recess | Recess | Recess | — |
|  | Amount of Warpage [GaN Film] (μm) | 660 | 650 | 250 | 240 | 230 | 180 | 10 | — |
|  | Crack Count in GaN Film | Many | Many | Few | Few | Extremely few | Extremely few | Few | Few |
|  | Dislocation Density of GaN Film ($10^8$ cm$^{-2}$) | 5 | 5 | 2 | 2 | 1 | 1 | 2 | — |
|  | Notes |  |  |  |  |  |  |  |  |

TABLE 5

|  |  | Wafer E1 | Wafer E2 | Wafer E3 | Wafer E4 | Wafer E5 | Wafer E6 | Wafer E7 | Wafer E8 |
|---|---|---|---|---|---|---|---|---|---|
| Composite Substrate | YSZ Content (Mass %) | 35 | 35 | 35 | 35 | 35 | 35 | 35 | 35 |
|  | $Y_2O_3$ Content (Mol %) | 0 | 3 | 5 | 6 | 10 | 20 | 50 | 100 |
|  | Coefficient of Thermal Expansion $\alpha_S$ ($10^{-6}/°C$.) | 4.77 | 4.86 | 5.80 | 5.81 | 5.85 | 5.96 | 6.27 | — |
|  | $\alpha_S/\alpha_{GaN-a}$ Ratio | 0.816 | 0.832 | 0.993 | 0.995 | 1.002 | 1.020 | 1.074 | — |
| Wafer | Shape of Warpage [GaN Film Side] | Recess | Recess | Recess | Recess | Recess | Projection | Projection | — |
|  | Amount of Warpage [GaN Film] (μm) | 630 | 520 | 150 | 120 | 1 | 7 | 12 | — |
|  | Crack Count in GaN Film | Many | Many | Few | Extremely few | Extremely few | Few | Few | Few |
|  | Dislocation Density of GaN Film ($10^8$ cm$^{-2}$) | 5 | 5 | 2 | 1 | 1 | 2 | 2 | — |
|  | Notes |  |  |  |  |  |  |  |  |

TABLE 6

|  |  | Wafer F1 | Wafer F2 | Wafer F3 | Wafer F4 | Wafer F5 | Wafer F6 | Wafer F7 | Wafer F8 |
|---|---|---|---|---|---|---|---|---|---|
| Composite Substrate | YSZ Content (Mass %) | 40 | 40 | 40 | 40 | 40 | 40 | 40 | 40 |
|  | $Y_2O_3$ Content (Mol %) | 0 | 3 | 5 | 6 | 10 | 20 | 50 | 100 |
|  | Coefficient of Thermal Expansion $\alpha_S$ ($10^{-6}/°C$.) | 4.97 | 5.07 | 6.05 | 6.06 | 6.10 | 6.21 | 6.54 | — |
|  | $\alpha_S/\alpha_{GaN-a}$ Ratio | 0.851 | 0.868 | 1.036 | 1.038 | 1.045 | 1.064 | 1.120 | — |
| Wafer | Shape of Warpage [GaN Film Side] | Recess | Recess | Projection | Projection | Projection | Projection | Projection | — |
|  | Amount of Warpage [GaN Film] (μm) | 500 | 480 | 10 | 10 | 11 | 12 | 110 | — |

TABLE 6-continued

|  | Wafer F1 | Wafer F2 | Wafer F3 | Wafer F4 | Wafer F5 | Wafer F6 | Wafer F7 | Wafer F8 |
|---|---|---|---|---|---|---|---|---|
| Crack Count in GaN Film | Many | Many | Few | Few | Few | Few | Few | Few |
| Dislocation Density of GaN Film ($10^8$ cm$^{-2}$) | 5 | 5 | 2 | 2 | 2 | 2 | 2 | — |
| Notes |  |  |  |  |  |  |  |  |

TABLE 7

|  |  | Wafer G1 | Wafer G2 | Wafer G3 | Wafer G4 | Wafer G5 | Wafer G6 | Wafer G7 | Wafer G8 |
|---|---|---|---|---|---|---|---|---|---|
| Composite Substrate | YSZ Content (Mass %) | 70 | 70 | 70 | 70 | 70 | 70 | 70 | 70 |
|  | $Y_2O_3$ Content (Mol %) | 0 | 3 | 5 | 6 | 10 | 20 | 50 | 100 |
|  | Coefficient of Thermal Expansion $\alpha_S$ ($10^{-6}$/°C.) | 4.99 | 5.09 | 6.07 | 6.08 | 6.12 | 6.23 | 6.56 | — |
|  | $\alpha_S/\alpha_{GaN-a}$ Ratio | 0.854 | 0.872 | 1.039 | 1.041 | 1.048 | 1.067 | 1.123 | — |
| Wafer | Shape of Warpage [GaN Film Side] | Recess | Recess | Projection | Projection | Projection | Projection | Projection | — |
|  | Amount of Warpage [GaN Film] (μm) | 510 | 490 | 10 | 11 | 11 | 12 | 110 | — |
|  | Crack Count in GaN Film | Extremely many | Extremely many | Extremely many | Extremely many | Extremely many | Extremely many | Extremely many | Extremely many |
|  | Dislocation Density of GaN Film ($10^8$ cm$^{-2}$) | 5 | 5 | 2 | 2 | 2 | 2 | 2 | — |
|  | Notes |  |  |  |  |  |  |  |  |

TABLE 8

|  |  | Wafer H1 | Wafer H2 | Wafer H3 | Wafer H4 | Wafer H5 | Wafer H6 | Wafer H7 | Wafer H8 |
|---|---|---|---|---|---|---|---|---|---|
| Composite Substrate | YSZ Content (Mass %) | 100 | 100 | 100 | 100 | 100 | 100 | 100 | 100 |
|  | $Y_2O_3$ Content (Mol %) | 0 | 3 | 5 | 6 | 10 | 20 | 50 | 100 |
|  | Coefficient of Thermal Expansion $\alpha_S$ ($10^{-6}$/°C.) | — | — | — | — | — | — | — | — |
|  | $\alpha_S/\alpha_{GaN-a}$ Ratio | — | — | — | — | — | — | — | — |
| Wafer | Shape of Warpage [GaN Film Side] | — | — | — | — | — | — | — | — |
|  | Amount of Warpage [GaN Film] (μm) | — | — | — | — | — | — | — | — |
|  | Crack Count in GaN Film | Extremely many | Extremely many | Extremely many | Extremely many | Extremely many | Extremely many | Extremely many | Extremely many |
|  | Dislocation Density of GaN Film ($10^8$ cm$^{-2}$) | — | — | — | — | — | — | — | — |
|  | Notes |  |  |  |  |  |  |  |  |

Referring to Tables 2 to 8, by employing a composite substrate (wafers B3 to B7, C3 to C7, D3 to D7, E1 to E7, F1 to F7, and G1 to G7) having a support substrate in which coefficient of thermal expansion $\alpha_S$ in a main surface was more than 0.8 time and less than 1.2 times (that is, 0.8<($\alpha_S/\alpha_{GaN-a}$ ratio)<1.2) as high as coefficient of thermal expansion $\alpha_{GaN-a}$ of GaN crystal, a GaN film less in warpage, low in dislocation density, and excellent in crystallinity could be formed. In addition, from a point of view of further decrease in warpage and dislocation density of the GaN film, coefficient of thermal expansion $\alpha_S$ in a main surface of the support substrate of the composite substrate was preferably more than 0.9 time and less than 1.15 times (that is, 0.9<($\alpha_S/\alpha_{GaN-a}$ ratio)<1.15) as high as coefficient of thermal expansion $\alpha_{GaN-a}$ of the GaN crystal (wafers C3 to C7, D3 to D7, E3 to E7, F3 to F7, and G3 to G7) and further preferably more than 0.95 time and less than 1.1 times (that is, 0.95<($\alpha_S/\alpha_{GaN-a}$ ratio)<1.1) as high as coefficient of thermal expansion $\alpha_{GaN-a}$ of the GaN crystal (wafers C7, D3 to D7, E3 to E7, F3 to F6, and G3 to G6).

In addition, Table 9 summarizes relation between cracks counted in a GaN film (GaN-based film 20) grown on a GaN single crystal layer (GaN-based single crystal layer 23) of each of the 57 types of the composite substrates and a YSZ content and a $Y_2O_3$ content of each of the 57 types of support substrate 11 of the 57 types of composite substrate 10 in Table 2 to Table 8.

TABLE 9

| Cracks Counted in GaN Film | Y₂O₃ Content (Mol %) | | | | | | | |
|---|---|---|---|---|---|---|---|---|
| | 0 | 3 | 5 | 6 | 10 | 20 | 50 | 100 |
| YSZ Content (Mass %) 0 | | | | | Extremely many | | | |
| 20 | Many | Many | Few | Few | Few | Few | Few | Few |
| 25 | Many | Many | Few | Few | Few | Few | Extremely few | Few |
| 30 | Many | Many | Few | Few | Extremely few | Extremely few | Few | Few |
| 35 | Many | Many | Few | Extremely few | Extremely few | Few | Few | Few |
| 40 | Many | Many | Few | Few | Few | Few | Few | Few |
| 70 | Extremely many | Extremely many | Extremely many | Extremely many | Extremely many | Extremely many | Extremely many | Extremely many |
| 100 | Extremely many | Extremely many | Extremely many | Extremely many | Extremely many | Extremely many | Extremely many | Extremely many |

Referring to Table 9, when a content of YSZ to the total of mullite (an Al$_2$O$_3$—SiO$_2$ composite oxide) and YSZ (yttria stabilized zirconia) contained in the support substrate of the composite substrate was not lower than 20 mass % and not higher than 40 mass % and more preferably not lower than 25 mass % and not higher than 35 mass %, cracks counted in the GaN film (GaN-based film) formed on the GaN film (single crystal film) of the composite substrate significantly decreased. In addition, when a content of Y$_2$O$_3$ (yttria) to YSZ was not lower than 5 mol % and more preferably not lower than 6 mol % and not higher than 50 mol %, cracks counted in the GaN film (GaN-based film) formed on the GaN film (single crystal film) of the composite substrate extremely significantly decreased.

Though a case where a non-doped GaN film was formed on the composite substrate was shown in the example above, substantially the same results as in the example above were obtained also in a case where a GaN film provided with n- or p-type conductivity by doping was formed and in a case where a GaN film of which resistivity was raised by doping was formed.

Further, in a case of forming a GaN-based film such as a Ga$_x$In$_y$Al$_{1-x-y}$N film (x>0, y≥0, x+y≤1) instead of a GaN film as well, results as in the example above were obtained. In particular, in a case of forming a Ga$_x$In$_y$Al$_{1-x-y}$N film (x>0.5, y≥0, x+y≤1) instead of a GaN film, substantially the same results as in the example above were obtained.

Furthermore, a plurality of GaN-based films (specifically, Ga$_x$In$_y$Al$_{1-x-y}$N films (x>0, y≥0, x+y≤1) and the like)) can also be formed by varying a composition ratio of such a group III element as Ga, In and Al. Namely, a plurality of GaN-based films such as Ga$_x$In$_y$Al$_{1-x-y}$N films (x>0, y≥0, x+y≤1) and the like instead of a GaN film can be formed by varying a composition ratio of such a group III element as Ga, In and Al.

In carrying out the present invention, a known dislocation lowering technique such as an ELO (Epitaxial Lateral Overgrowth) technique is applicable in forming a GaN-based film.

In addition, after the GaN-based film is formed on the composite substrate, only the support substrate of the composite substrate or the entire composite substrate (the support substrate and the single crystal film) may be etched away. Here, the GaN-based film may be transferred to another support substrate.

It should be understood that the embodiments and the examples disclosed herein are illustrative and non-restrictive in every respect. The scope of the present invention is defined by the terms of the claims, rather than the description above, and is intended to include any modifications within the scope and meaning equivalent to the terms of the claims.

Reference Signs List 10 composite substrate; 11 support substrate; 11m, 12m, 12am, 12bn, 13m, 13n, 21m, 23m, 30n main surface; 12, 12a, 12b adhesive layer; 13 single crystal film; 20 GaN-based film; 21 GaN-based buffer layer; 23 GaN-based single crystal layer; 30 underlying substrate; and 40 wax.

The invention claimed is:

1. A method of manufacturing a GaN-based film, comprising the steps of:
    preparing a composite substrate, the composite substrate including a support substrate in which a coefficient of thermal expansion in a main surface is more than 0.8 time and less than 1.2 times as high as a coefficient of thermal expansion of GaN crystal in a direction of a axis and a single crystal film arranged on a side of a main surface of said support substrate, said single crystal film having threefold symmetry with respect to an axis perpendicular to a main surface of said single crystal film; and
    forming a GaN-based film on the main surface of said single crystal film in said composite substrate.

2. The method of manufacturing a GaN-based film according to claim 1, wherein said main surface of said single crystal film in said composite substrate has an area equal to or greater than 45 cm$^2$.

3. The method of manufacturing a GaN-based film according to claim 1, wherein
    said support substrate of said composite substrate is made of a sintered body containing an oxide.

4. The method of manufacturing a GaN-based film according to claim 1, wherein
    said support substrate of said composite substrate contains yttria stabilized zirconia and an Al$_2$O$_3$—SiO$_2$ composite oxide formed of alumina and silica.

5. The method of manufacturing a GaN-based film according to claim 4, wherein
    a content of said yttria stabilized zirconia to total of said Al$_2$O$_3$—SiO$_2$ composite oxide and said yttria stabilized zirconia is not lower than 20 mass % and not higher than 40 mass %.

6. The method of manufacturing a GaN-based film according to claim 5, wherein
    a content of yttria to said yttria stabilized zirconia is not lower than 5 mol %.

7. The method of manufacturing a GaN-based film according to claim 1, wherein
said step of forming a GaN-based film includes sub steps of forming a GaN-based buffer layer on the main surface of said single crystal film and forming a GaN-based single crystal layer on a main surface of said GaN-based buffer layer.

* * * * *